United States Patent
Ou (10) Patent No.: US 9,118,205 B2
(45) Date of Patent: Aug. 25, 2015

(54) MICROGRID POWER DISTRIBUTION SYSTEM AND POWER FLOW ASYMMETRICAL FAULT ANALYSIS METHOD THEREFOR

(75) Inventor: Ting-Chia Ou, Taoyuan (TW)

(73) Assignee: INSTITUTE OF NUCLEAR ENERGY RESEARCH ATOMIC ENERGY COUNCIL, EXECUTIVE YUAN, Taoyuan County (TW)

( * ) Notice: Subject to any disclaimer, the term of this patent is extended or adjusted under 35 U.S.C. 154(b) by 586 days.

(21) Appl. No.: 13/528,043

(22) Filed: Jun. 20, 2012

(65) Prior Publication Data
US 2013/0346011 A1 Dec. 26, 2013

(51) Int. Cl.
*H02J 3/06* (2006.01)
*H02J 3/38* (2006.01)
*H02J 3/00* (2006.01)

(52) U.S. Cl.
CPC . *H02J 3/06* (2013.01); *H02J 3/382* (2013.01); *H02J 2003/001* (2013.01); *H02J 2003/007* (2013.01)

(58) Field of Classification Search
CPC .......................................................... H02J 3/06
USPC .......................................................... 702/123
See application file for complete search history.

(56) References Cited

U.S. PATENT DOCUMENTS

| | | |
|---|---|---|
| 2012/0022713 A1* | 1/2012 | Deaver et al. ................. 700/298 |
| 2013/0338945 A1* | 12/2013 | Feng et al. ...................... 702/58 |
| 2014/0229029 A1* | 8/2014 | Chu et al. ...................... 700/293 |

* cited by examiner

*Primary Examiner* — Bryan Bui
(74) *Attorney, Agent, or Firm* — WPAT, PC; Justin King (57) ABSTRACT

A fault analysis method includes: using a matrix of two sets of microgrid power distribution networks to analyze and solve a fault current, and for various types of faults of the distributed power distribution system, obtaining appropriate boundary conditions to calculate a variety of different types of single or simultaneous fault currents of load points. The present invention may be further applied to a situation where a bus or impedance or parallel loop is added. The present invention has good robustness and execution speed, and requires small memory space for calculation of analysis and identification of a power flow fault of the distributed power distribution system, and may be actually applied to an instrument control system for identification and analysis of a fault of a large-scalemicrogrid distribution system.

9 Claims, 7 Drawing Sheets

MICROGRID POWER DISTRIBUTION SYSTEM AND POWER FLOW ASYMMETRICAL FAULT ANALYSIS METHOD THEREFOR

TECHNICAL FIELD

The present invention relates to a microgrid distribution system and a power flow asymmetrical fault analysis method therefor, and more particularly to, a fault analysis method for a three-phase and single-phase mixed power distribution system.

TECHNICAL BACKGROUND

Figure 1:
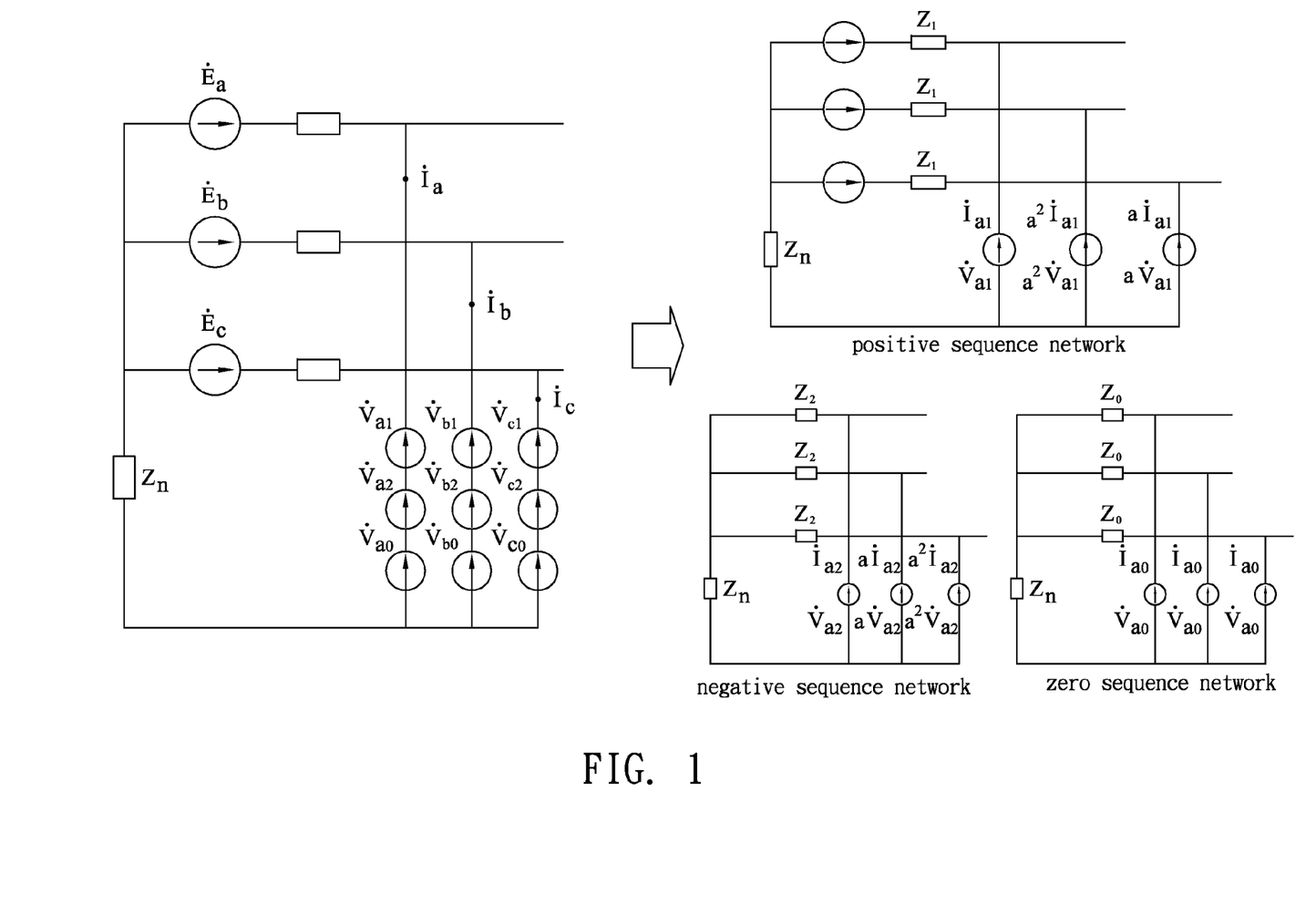
FIG. 1 illustrates the prior art.

Referring to FIG. 1, it shows that a fault current of an asymmetrical fault of a conventional system must be analyzed by use of a symmetrical component method. Specifically, the system is decomposed into a positive, a negative and a zero phase sequence network, and serial and parallel connections of the positive, the negative and the zero phase sequence network are respectively performed according to various types of asymmetrical faults, such as a single line-to-ground (SLG) fault, a two-phase short circuit fault, and a double line-to-ground (DLG) fault, to solve the fault current of the asymmetrical fault. The process is rather cumbersome and time-consuming. Moreover, when a bus or impedance is added to the system, a Jacobian matrix or Y admittance matrix therein must be calculated and analyzed again, and the process is rather complicated, which reduces the execution speed and consumes a great deal of memory space. In addition, the conventional symmetrical component method is mainly applied to a three-phase network, which may be decomposed into three phase sequence networks, that is, a positive, a negative and a zero phase sequence network. However, when the power distribution system is a three-phase and single-phase mixed network, the application of the symmetrical component method is limited, and in actual application, power networks of a majority of microgrid power distribution systems are in a three-phase and single-phase mixed state, so that for the application of a smart instrument, it is necessary to provide an innovative and progressive system fault analysis and identification method, to solve the foregoing problem.

Many applications, such as network optimization, reactive-power planning, feeder reconfiguration, state estimation, short-circuit-analysis etc. are necessary to construct microgrid distribution automation (MGDA) effectively. These are the important tools for improving reliability and efficiency for off-line planning and real time operation of the protective needs of MGDA. A microgrid is made up of large numbers of on-site distributed generators (DGs), which may include microturbine generations (MTGs), battery energy storage systems (BESSs), photovoltaic cells, diesel engines, wind energy conversion systems, fuel cells, etc. The MGDA is expected to improve the penetration ratio of renewable energy so that it will diminish $CO_2$ emissions. A robust and efficient faults analysis program is needed to solve MGDA networks in real-time. The real-time asymmetrical faults analysis is oriented toward applications in the operations area rather than in planning analysis. The results of such asymmetrical fault studies can be used for microgrid distribution (MGD) adaptive relay coordination and settings when feeder reconfiguration is performed automatically.

Therefore, the present invention provides a method for analyzing and identifying a power flow asymmetrical fault of a microgrid power distribution system, and particularly for symmetrical and asymmetrical fault analysis, which is not limited by the three-phase and single-phase mixed situation. The application of the present invention is more practical.

SUMMARY

The present invention provides a method using an equivalent current injection model in combination with mixed compensation, to directly analyze and identify the fault in distribution network system.

The present invention provides a method uses a simple integrated instrument control system such as a smart meter to analyze fault types of a power system in a mixed compensation manner through iterative computation skills and in combination with boundary conditions.

The mixed compensation asymmetrical fault analysis method applied to a microgrid power distribution network mentioned in the present invention is to perform simulation based on an actual three-phase model in cooperation with boundary conditions and iterative skills, input parameters of this method are still relevant data dominated by branches and buses for the distribution network, and the method is also widely used in this field. Equations formed in the present invention are characterized by a structure of a microgrid power distribution network topology shape, can analyze and identify a fault current efficiently, and may analyze fault situations of different types of single or simultaneous multiple load points in combination with appropriate boundary conditions for asymmetrical faults.

An indispensable time-consuming decomposition method in the prior art, such as re-establishment of a Jacobian matrix or Y admittance matrix, is no longer adopted in the new method, and meanwhile, the simulation test result proves that the method proposed by the present invention is programmable and efficient, and is advantageous in speediness and robustness, and has low memory demands. Moreover, information of a bus fault current, a branch current of the distributed power distribution system, and a post-fault bus voltage may all be obtained one by one in the analysis procedure. Furthermore, a relevant branch current of the power distribution network system derived by a fault is also another important output in the fault analysis procedure, and may be used for setting the relays for protection and coordination, so as to expand the application range of this method in a smart-grid system.

The present invention provides a fault analysis and identification theory for a microgrid power distribution system in combination with computation of a smart meter, which is applicable to an analysis strategy for a large-scale power distribution system, and comprises: analyzing a fault current in combination with boundary conditions of a fault bus and in cooperation with iterative skills by use of a compensation method. The process of an asymmetrical fault analysis method for an unbalanced power distribution system proposed by the present invention is only required to use two pre-defined relation matrixes, and perform iterative calculation in combination with boundary conditions of an asymmetrical fault of the bus, so that a single or multiple synchronous fault currents may be analyzed and identified. The contribution of this method lies in that, in addition to calculating a fault current, change information of a post-fault injection current, a post-fault branch current and a post-fault bus voltage may be obtained by compensating the change amount of a post-fault injection branch current of all fault points in the original system network. More importantly, information of the whole branch current of the post-fault system may also be obtained in the fault analysis procedure, which may enhance the whole protection and coordination function analysis of the distribution network. Additionally, the method proposed by the present invention also has sufficient extensibility, other models may be introduced therein, such as equivalent circuits of other load apparatuses, and added branch admittance may also be included in the method. Compared with other conventional methods, the system and the method of the present invention have good robustness for fault analysis of the microgrid power distribution system.

An embodiment of the present invention is a microgrid power distribution system, and devices of the power distribution system include: a smart meter, being a programmable device applying a fault analysis method, in which the fault analysis method includes: selecting at least one of SLG fault analysis, DLG fault analysis, open-conductor fault analysis, line-to-line (LL) fault analysis, and microturbine generation (MTG) fault analysis to solve a fault current, and for various types of faults of the microgrid power distribution system, obtaining appropriate boundary conditions to calculate a variety of different types of single or simultaneous fault currents of buses; and a plurality of buses, at least one of which is connected to the smart meter. The fault analysis method uses main relation matrix $Z_{MGD}$.

Another embodiment of the present invention is a power flow fault analysis method for a power distribution system, which adopts main relation matrix $Z_{MGD}$. The fault analysis method includes: (a) an SLG fault analysis step; (b) a DLG fault analysis step; (c) an open-conductor fault analysis step; (d) an LL fault analysis step; and (e) an MTG fault analysis step.

BRIEF DESCRIPTION OF THE DRAWINGS

The present invention will become more fully understood from the detailed description given herein below for illustration only, and thus are not limitative of the present invention, and in which.

DESCRIPTION OF THE EXEMPLARY EMBODIMENTS

Figure 2:
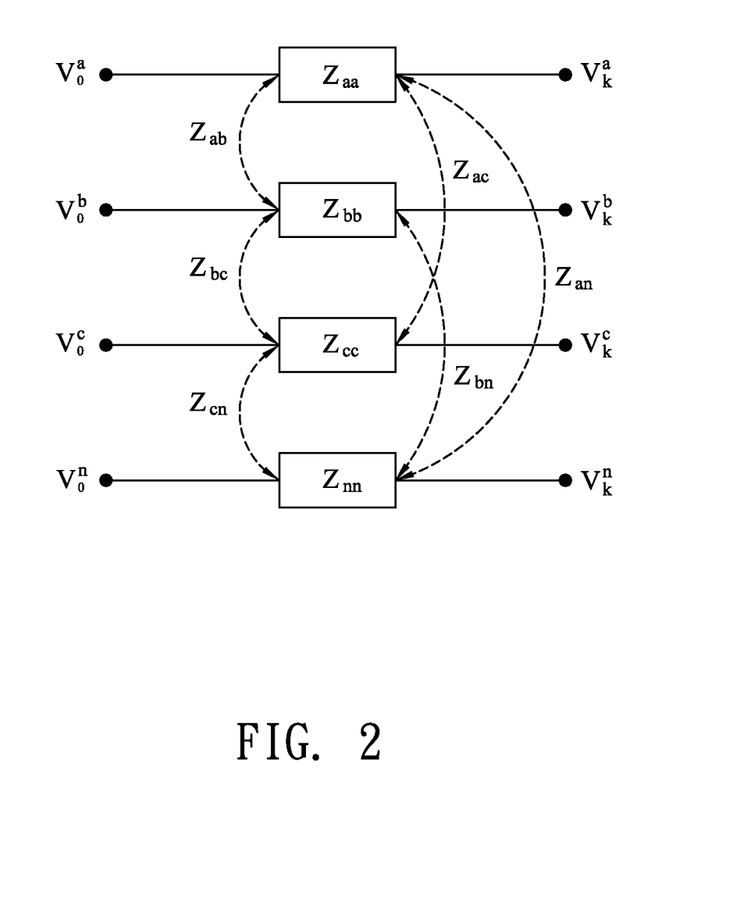
FIG. 2 illustrates a three-phase line segment model of a bus 0 and a bus k.

Referring to FIG. 2, an unbalanced three-phase line segment model between a bus 0 and a bus k is taken into account. An equation (1) is a 4×4 matrix, and individual and mutual coupling effects of unbalanced three-phase line segments are taken into account:

$$[Z_{0k}^{abcn}] = \begin{bmatrix} Z_{aa} & Z_{ab} & Z_{ac} & Z_{an} \\ Z_{ba} & Z_{bb} & Z_{bc} & Z_{bn} \\ Z_{ca} & Z_{cb} & Z_{cc} & Z_{cn} \\ Z_{na} & Z_{nb} & Z_{nc} & Z_{nn} \end{bmatrix} \quad (1)$$

Figure 3:
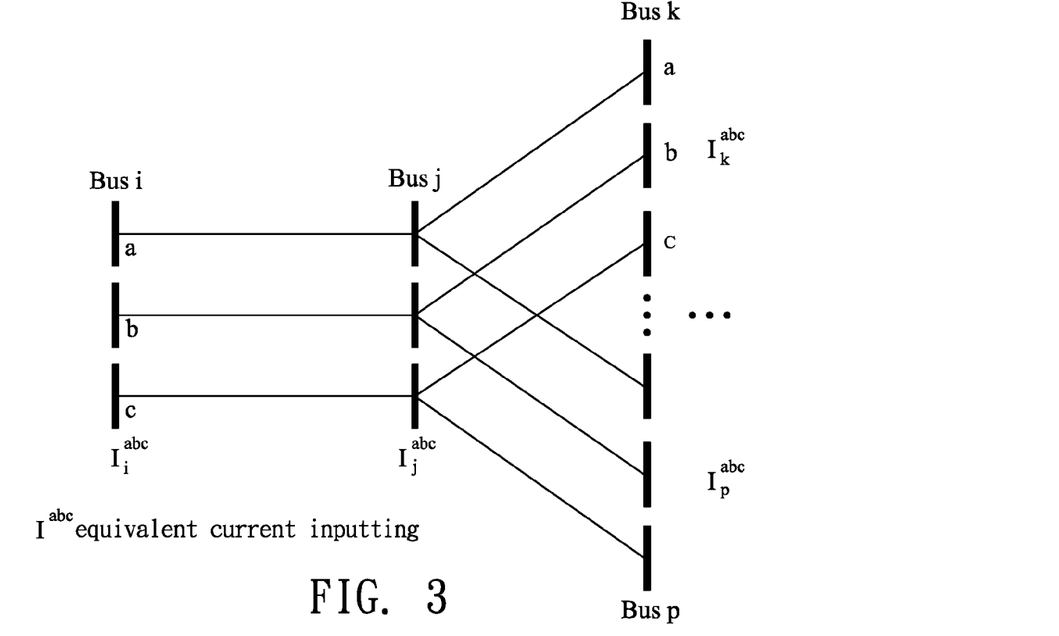
FIG. 3 illustrates an equivalent current injection network of an unbalanced power distribution system.

As shown in FIG. 3, for a power distribution network of a distributed power distribution system, a relation between a branch voltage and a bus injection current of a bus j may be obtained from a formula (2a):

$$[I_j^{abc}] = [Y_{ij}^{abc}][V_{ij}^{abc}] - \sum_{l=k}^{p} [Y_{jl}^{abc}][V_{jl}^{abc}]. \quad (2a)$$

It can be seen from the formula (2a) that, a bus injection current can be obtained from a branch admittance matrix and a branch voltage, and in this way, another power flow analysis selection is also provided.

The present invention mainly uses two main relation matrixes $B_I$ and $Z_{V\text{-}BC}$ as a theory in which a smart meter analyzes and identifies a fault of the microgrid power distribution system, and the relation matrixes are both established through the shape structure and topology characteristics of the microgrid distribution (MGD) network. $B_I$ is a relation matrix between a bus injection current and a branch current, and $Z_{V\text{-}BC}$ describes a relation between a bus voltage change difference and the branch current. The relation matrix between a bus injection current [I] and a branch current [B] is denoted as $[B]=B_I [I]$, and here, the matrix $B_I$ is an upper triangular matrix only including values of 0 and 1. Also, the relation matrix between a branch current and a bus voltage difference matrix $[\Delta V]$ is denoted as $[\Delta V]=Z_{V\text{-}BC} B_I [I] = [Z_{MGD}][I]$, in which the matrix $Z_{V\text{-}BC}$ is an inter-bus impedance and is a lower triangular matrix. And the solution for microgrid distribution (MGD) power flow can be achieved directly using the $Z_{MGD}$ matrix by solving iteratively from the formula (2b).

$$[\Delta V^i] = [Z_{MGD}][I^i]$$

$$[V^{i+1}] = [V_0] - [\Delta V^i] \quad (2b).$$

Figure 10:
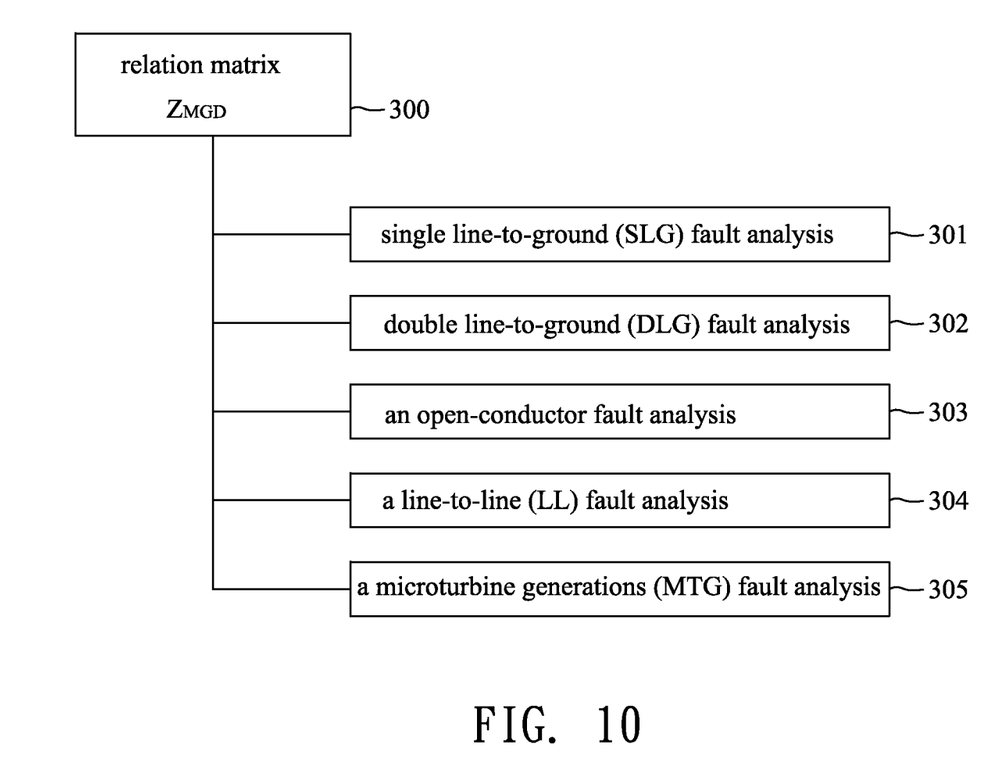
FIG. 10 is a flowchart of analyzing and identifying a power distribution system fault.

Please refer FIG. 10, which illustrates a fault analysis and identification method for the power distribution system with implementation methods as follows:

a. step 301 for performing a single-line-to-ground (SLG) fault analysis;
b. step 302 for performing a double-line-to-ground (DLG) fault analysis;
c. step 303 for performing an Open-conductor fault analysis;
d. step 304 for performing a line-to-line (LL) fault analysis; and
e. step 305 for performing a microturbine generations (MTG) fault fanalysis;

wherein a smart apparatus being a programmable device executes the SLG, DLG, LL, open-conductor fault analysis, and MTG fault analysis method by using main relation matrix $Z_{MGD}$ 300.

Generally, main asymmetrical faults of the power distribution system include an SLG fault, an LL fault, a DLG fault and an open-conductor fault, and an LL or line-to-ground fault current path includes an impedance $Z_f$. In different faults, it is required to obtain appropriate fault boundary conditions, which may be used for calculating the branch current and correcting the bus voltage.

a. SLG Fault

Figure 4:
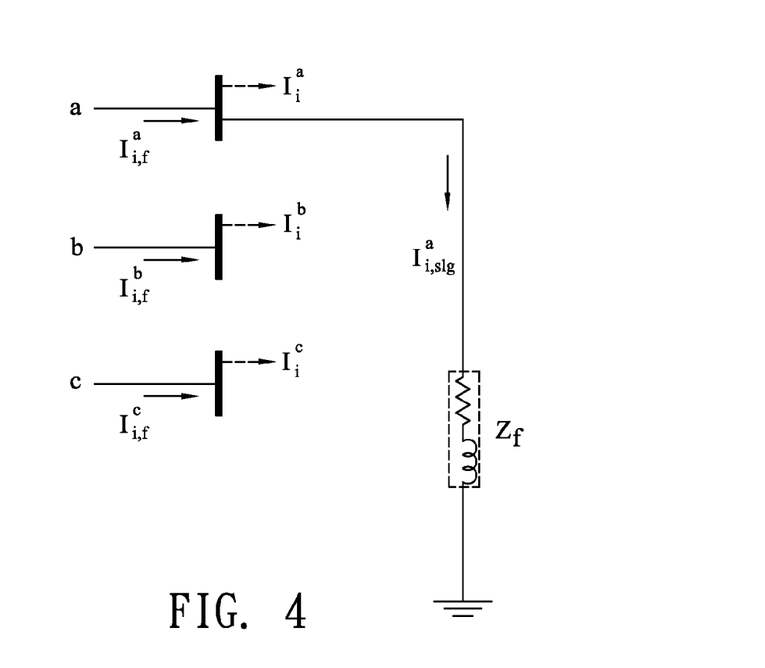
FIG. 4 illustrates an SLG fault.

The SLG fault generally results from lightning or conductor grounding. As shown in FIG. 4, through the impedance $Z_f$, the SLG fault occurs in a phase a of a Bus i, and boundary conditions are denoted as:

$$I_{i,f}^a = I_i^a + I_{i,slg}^a, I_{i,f}^b = I_i^b, I_{i,f}^c = I_i^c \quad (3a)$$

$$V_{i,f}^a = Z_f I_{i,slg}^a \quad (3b)$$

Here, $I_{i,f}^a$, $I_{i,f}^b$ and $I_{i,f}^c$ are equivalent currents occurring in fault locations of the phase a, a phase b and a phase c and flowing into the Bus i, $I_i^a$, $I_i^b$ and $I_i^c$ are pre-fault currents, and $V_{i,0}^a$ and $V_{i,f}^a$ are respectively a pre-fault voltage and a post-fault voltage.

In the formula (3), if an SLG fault occurs in the phase a of the Bus i, a fault current flows to the ground, a bus voltage of the phase a is changed from $V_{i,0}^a$ to $Z_f I_{i,slg}^a$, and after the fault, the change amount of the bus current is denoted as:

$$\Delta I_{i,f}^a = I_{i,slg}^a, \Delta I_{i,f}^b = 0, \Delta I_{i,f}^c = 0 \quad (4a).$$

Through iteration, a fault voltage iterative formula is denoted as follows:

$$\Delta V_{i,f}^a = V_{i,0}^a - Z_f I_{i,slg}^a \quad (4b)$$

$$\Delta I_{i,f}^a = \frac{V_{i,0}^a - \Delta V_{i,f}^a}{Z_f}.$$

The variations of the branch currents generated by the fault current in MGD can be expressed as $$[\Delta B_i^a] = [B_I][0 \ldots \Delta I_{i,f}^a 0 \ldots]^T \quad (5),$$

where $B_I$ is the bus injection to branch current matrix pre-fault. In MGD by the fault, the general form for the branch currents matrix is $$[B_f] = [B_{MGD}] + [\Delta B_f^a] \quad (6).$$

The bus mismatch voltages caused by the fault branch currents $\Delta B_f$ can be rewritten as $$[\Delta V_f] = [Z_{V-BC}][B_f] = [Z_{MGD}][I_f] \quad (7).$$

After a single-line-to-ground fault occurs, the branch mismatch currents and bus mismatch voltages caused by the single-line-to-ground fault can be calculated directly and the solution for MGD power flow can be achieved by solving (11b) and (15) iteratively.

$$[\Delta V_f^i] = [Z_{MGD,i}][I_f^i] \quad (8a).$$

A post-fault voltage of each bus is calculated by use of the following formula:

$$[V_f] = [V_0] - [\Delta V_f] \quad (8b),$$

wherein $V_0$ is a no-load voltage or bus reference voltage b. DLG Fault

Figure 5:
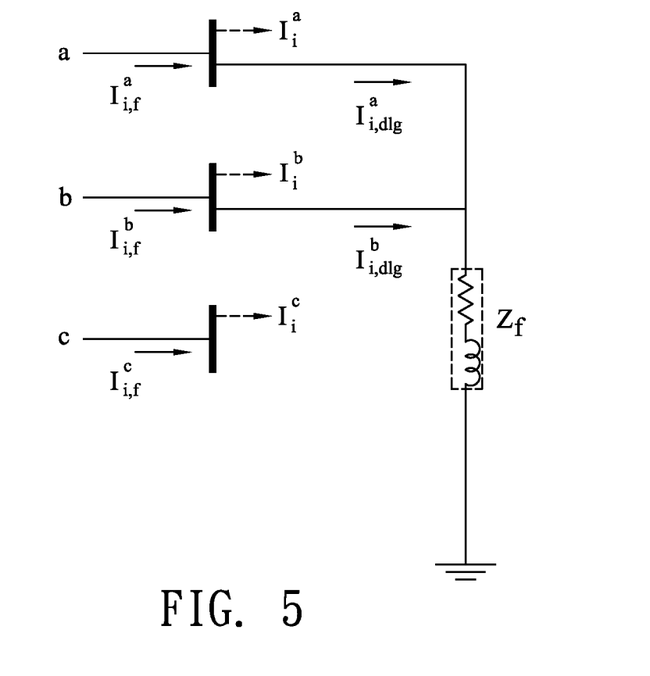
FIG. 5 illustrates a DLG fault.

It is assumed that a line connection manner of a DLG fault is shown in FIG. 5, and it is assumed that a DLG fault occurs in a phase a and a phase b of a Bus i through an impedance $Z_f$, and boundary conditions are denoted as:

$$\Delta I_{i,f}^a = I_{i,dlg}^a, \Delta I_{i,f}^b = I_{i,dlg}^b, \Delta I_{i,f}^c = 0 \quad (9a).$$

$$V_{i,f}^a = V_{i,f}^b = Z_f(\Delta I_{i,f}^a + \Delta I_{i,f}^b) \quad (9b).$$

Similarly, a fault voltage iterative formula and a fault current iterative formula thereof are denoted as follows:
The variations of the branch currents generated by the fault currents in MGD can be expressed as $$[\Delta B_f^{ab}] = [B_I][0 \ldots \Delta I_{i,f}^a \Delta I_{i,f}^b 0 \ldots]^T \quad (10).$$

In MGD, the fault branch currents $B_f$ caused by the fault currents can be rewritten as $$[B_f] = [B_{MGD}] + [\Delta B_f^{ab}] \quad (11)$$

The bus mismatch voltages caused by the fault branch currents $B_f$ can be rewritten as $$[\Delta V_f] = [Z_{V-BC}][B_f] = [Z_{MGD}][I_f] \quad (12)$$

$$[I_f] = [Z_{MGD,i}]^{-1}[\Delta V_f] \quad (13).$$

The fault currents and bus mismatch voltages caused by the double line-to-ground fault can be calculated directly and the solution for MGD power flow can be achieved by solving (12).

c. Open-Conductor Fault

As long as an open-conductor fault occurs in any one phase of a three-phase circuit, an unbalanced and asymmetrical current is generated, which includes a phenomenon that an open-conductor fault occurs in two of the three phases, the third phase maintains a closed state, and an unbalanced current still occurs. Therefore, when a breaking accident occurs in a single-phase or double-phase transmission line conductor accidentally, a situation that the three-phase system is unbalanced and an asymmetrical current is generated is caused. In a general current overload event, sometimes, a fuse or other switch elements on a single lead or double leads trip due to current overload, so as to cause a fuse or other switch elements on other leads to react, and in this case, faults may be analyzed and identified through the smart meter system of the present invention to avoid the foregoing problem.

Figure 6:
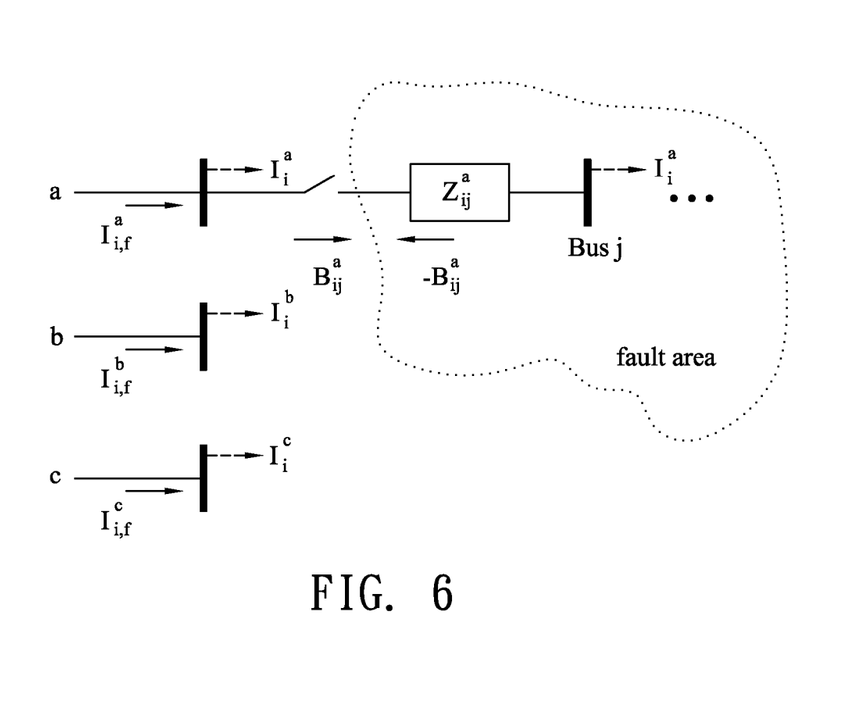
FIG. 6 illustrates an open-conductor fault.

FIG. 6 shows an open-conductor fault in a three-phase circuit, and a branch current of a phase a is $B_{ij}^a$, which denotes that the branch current flows from a Bus i to a Bus j. It is assumed that an open-conductor fault of the phase a occurs, and by use of a compensation theory, the open-conductor of the loop may be simulated by injecting negative currents at two ends of a breakpoint. After the open-conductor fault, the wiring system may be decomposed into two areas, and no power source is supplied to one area of the open-conductor fault of a load point, while a power source is normally supplied to a load point in the other area. Therefore, a negative branch current of a fault point generated by an open-conductor fault is a boundary condition of the open-conductor fault, which is denoted as:

$$[\Delta B_{f,OC}] = \begin{bmatrix} 0 & \cdots & \prod_{MG\ fault\ area} & -B_{ij}^a & 0 & \cdots \end{bmatrix}^T. \quad (14a)$$

The whole branch current of the system is rewritten as:

$$[B_f] = [B] + \Delta B_{f,OC} \quad (14b).$$

A bus voltage difference matrix caused by a fault branch current $\Delta B_f$ is denoted as:

$$[\Delta V_{f,OC}] = [Z_{V-BC,i}][B_{f,OC}] \quad (15).$$

A bus open-conductor fault voltage is directly calculated without iteration.

Hence after an open-conductor fault occurs, the bus mismatch voltages caused can be calculated directly and the solution for MGD power flow can be achieved by solving (15)

d. LL Fault

Figure 7:
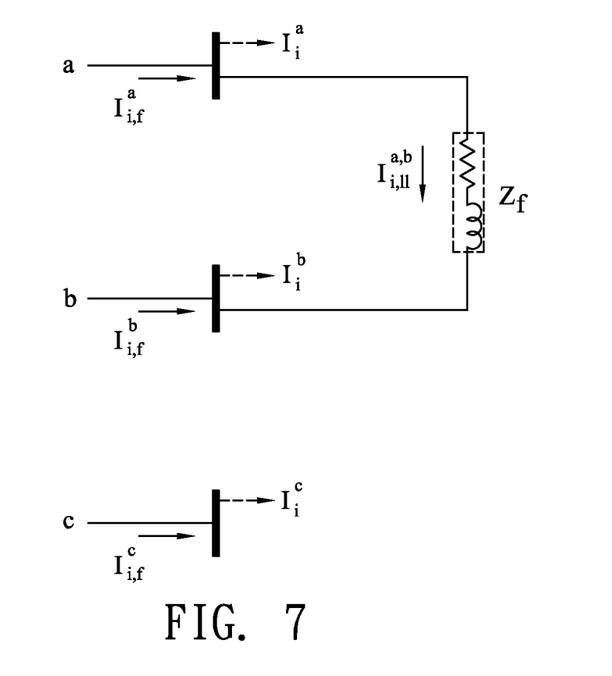
FIG. 7 illustrates an LL fault.

It is assumed that for the LL fault through an impedance $Z_f$, a three-line connection manner is shown in FIG. 7, and a phase a and a phase b of a Bus i are regarded as the LL fault, and boundary conditions of a fault point need to satisfy:

$$I_{i,f}^a = I_i^a + I_{i,ll}^{ab}, I_{i,f}^b = I_i^b - I_{i,ll}^{ab}, I_{i,f}^c = I_i^c \quad (16a)$$

$$V_{i,f}^a - V_{i,f}^b = Z_f I_{i,ll}^{ab} \quad (16b)$$

A fault current iterative formula thereof is denoted as follows:

$$\Delta I_{i,f}^{ab} = \frac{V_{i,f}^a - V_{i,f}^b}{Z_f}. \quad (16c)$$

Here, a pre-fault load flow voltage solution is used as an initial condition. Therefore, a fault point branch current generated by a fault is denoted as:

$$[B_f] = \begin{bmatrix} B_{I,origin} & \text{col} \cdot (B_i^a - B_i^b) \\ 0 & 1 \end{bmatrix} \begin{bmatrix} I_{origin} \\ \Delta I_{i,f}^{ab} \end{bmatrix}. \quad (17)$$

where the new column is column phase a minus column phase b of bus i of $B_{I,origin}$. The new row filled with "0" in $B_{I,origin}$. Finally, fill "1" to the end of the diagonal.

Similarly, a bus voltage difference matrix caused by a fault branch current $\Delta B_f$ is denoted as:

$$[\Delta V_f^i] = [Z_{V-BC,f}][B_f] = [Z_{MGD,f}][\Delta I_f^i] \quad (18a),$$

in which the $Z_{V-BC,f}$ matrix is $$[Z_{V-BC,f}] = \begin{bmatrix} Z_{V-BC,origin} & 0 \\ \text{row} \cdot (Z_i^a - Z_i^b) & Z_f \end{bmatrix}. \quad (18b)$$

where the new row is row phase a minus row phase b of bus i of $Z_{V-BC,origin}$. Finally, fill $Z_f$ to the position of the off-diagonal.

A bus voltage is obtained through each iteration update, and an iterative program is restarted from the formula (16c).

e. MTG Fault

A microgrid is an aggregation of multiple distributed generators (DGs). Nowadays, there is growing interest in deploying MTGs in DG application, because of their quick start capability and easy controllability in dispatchable mode for efficient regulation. In this section, two different operational modes for MTG in microgrid application are considered: grid-connected mode and stand-alone mode. The MTG model is used, shown in FIGS. 8A and FIG. 8B.

A. Stand-Alone Mode

Figure 8A:
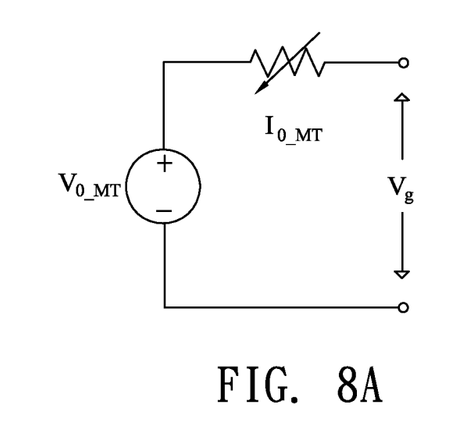
FIG. 8A and FIG. 8B respectively illustrate an MTG fault.

FIG. 8A shows the MTG circuit model when operated at the stand-alone mode. In the stand-alone operation, the MTG serves as an independent voltage source for supplying power to loads. The internal voltage $V_{0\_MT}$ is assumed constant at the instant of the fault. Hence the boundary conditions can be written as $$\Delta V_{0\_MT,f}^{abc} = 0$$

$$V_{g,f}^{abc} = V_f \quad (19).$$

A sensitivity matrix is used to calculate the injection current needed to keep the MTG's internal voltage constant. The relationships of voltage variations after a fault can be expressed as $$[V_{0\_MT,f}] - [V_f] = [Z_{0\_MT}][I_{g\_n,f}] \quad (20).$$

Equation (20) can then be rewritten as $$[V_{0\_MT,0} - \Delta V_{0\_MT,f}] - [V_{f,0} - \Delta V_f] = [Z_{0\_MT}][I_{g\_n,f}] \quad (21).$$

The internal voltage variations of the MTG are zeros by (19). Therefore, the MGT terminal bus correction voltages after the fault occurred can be expressed as $$[\Delta V_f^i] = [Z_{0\_MT,f}][I_{g\_n,f}^i] - [V_{0\_MT,0} - V_{f,0}] \quad (22)$$

$$I_{g,f} = \sum_{n=1}^{N} I_{g\_n,f},$$

where N is the number of connected power modules, and n is the nth module in MTG. Therefore, the voltages $V_f^{(i+1)}$ are dependent on the MTG condition by using (21) and (22) until a preset tolerance $\Delta V$ is reached.

B. Grid-Connected Mode

Figure 8B:
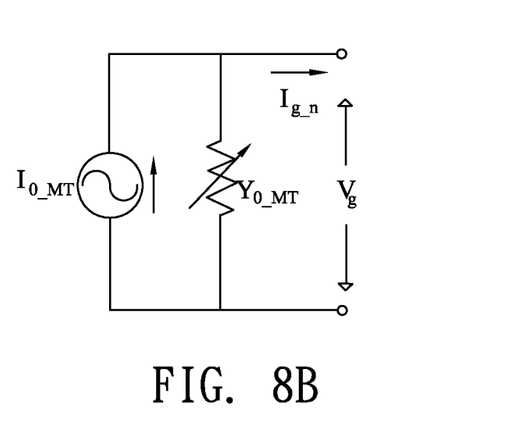

The MTG can operate as a power conditioner for the grid-connected mode to improve the microgrid quality of supplying power or sever as an emergency generator from the grid. Based on the control strategy of grid-connected concept, FIG. 8B shows the grid-connected circuit model.

The MTG terminal fault current can be written as $$[I_{g\_n,f}] = [I_{0\_MT}] - [Y_{0\_MT}][V_{g,f}] \quad (23)$$

$$I_{g,f} = \sum_{n=1}^{N} I_{g\_n,f}.$$

The admittance matrix $Y_{0\_MT}$ and the MTG internal balanced current source $I_{0\_MT}$ are held constant in faults analysis. With the load flow voltage solution by iterative process, we have $$[\Delta V_f^i] = [Z_{MGD,f}][I_{g,f}^i] \quad (24).$$

Therefore, the voltages $V_{g,f}^{(i+1)}$ are dependent on the MGD condition will change at each iteration by using (23) and (24) until a preset tolerance $\Delta V$ is reached.

The fault analysis and identification theory proposed by the present invention is applicable to asymmetrical fault analysis of a large-scale microgrid power distribution system, and may achieve advantages such as high accuracy, high efficiency computation and low memory demand. In addition to the fault current, this method may obtain the change $\Delta B_f$ resulting from the fault current and the change of the post-fault bus voltage in the solving procedure. More importantly, information of the whole branch current $B_f$ of the post-fault system may also be obtained in the fault analysis procedure, which may be used as the setting for protecting a relay, and enhance the whole protection and coordination of the system. In smart grids, the network topologies are flexible and the connections of distributed generations are dynamic; therefore, the method proposed by the present invention also has sufficient extensibility, other models may be combined, and the added branch admittance and bus may also be included in the method, so as to expand the application range of this method in the future smart grids.

Embodiment 1

Figure 9:
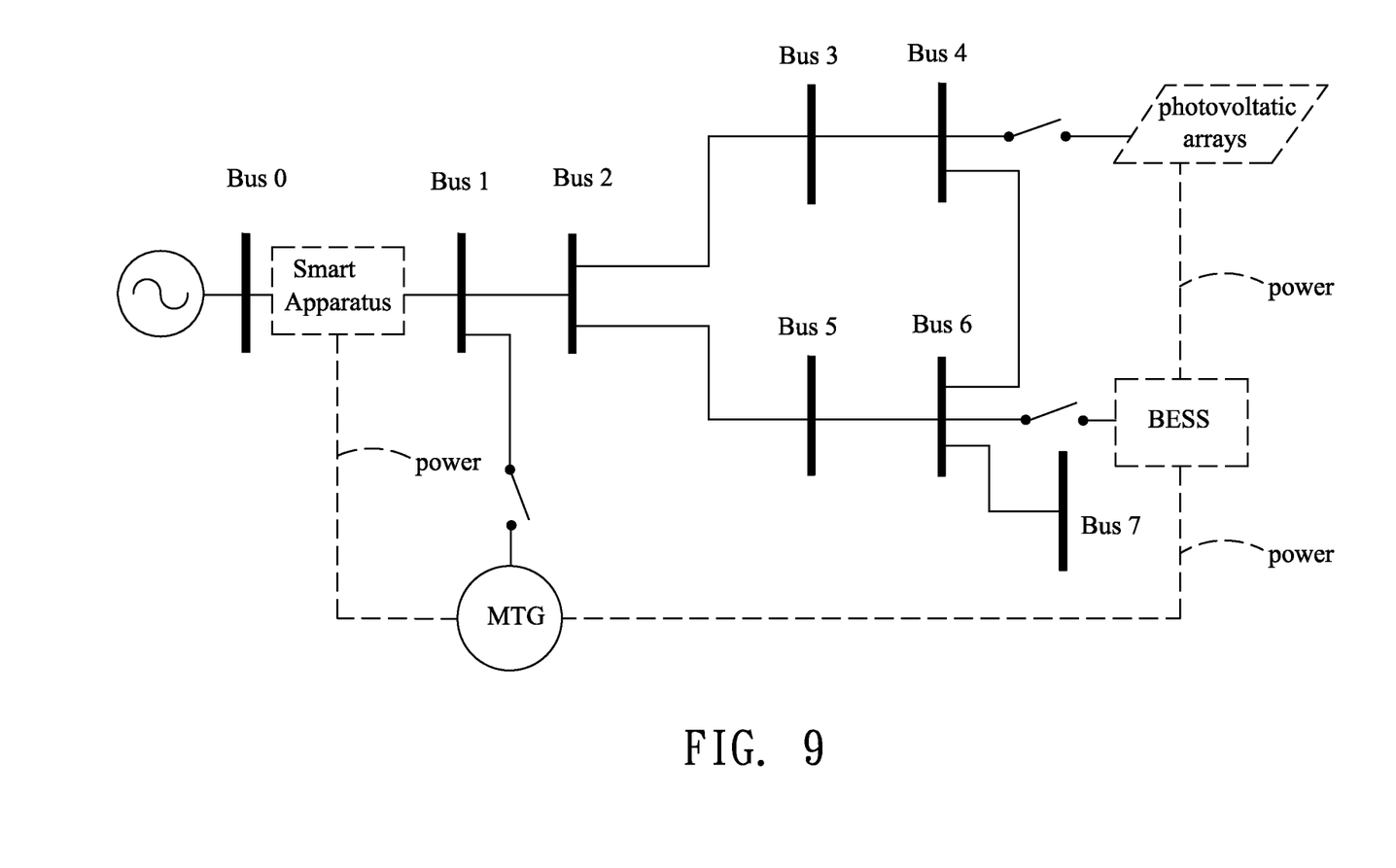
FIG. 9 illustrates a simple 8-bus MGD feeder.

The present invention proposes a fault analysis method in which a smart instrument for fault analysis and identification analyzes various types of faults of a microgrid power distribution system in a mixed compensation manner. The method mentioned herein performs analysis by use of an unbalanced three-phase model, and cooperating with the proposed mixed compensation method, a matrix including microgrid power distribution network topology structures is used for analyzing and solving the fault current. As shown in FIG. 9, a simple 8-bus MGD feeder consists of a grid, a smart apparatus being a programmable device, an MTG, a BESS, photovoltaic arrays, three-phase line sections and buses for example. The three-phase line sections are simulated by the line impedances, which have different values depending on the line length in MGD. The simple 8-bus MGD feeder example offer many scenario tests to substantiate the proposed method. Two different operational configurations are considered by the state of the smart apparatus: stand-alone operation and grid-connected operation. In case of stand-alone operation, microgrid power works in an isolated system. Thus the controllable energy sources acts as one of the several controllers for the voltage-frequency (VF) control; the controlled variables are the magnitude and the phase of the voltage. For microgrid power control center, an active power-voltage (PV) or a power-reactive power (PQ) control is adopted for the MTG inverter in case of the grid-connected.

Contributions of the microgrid power distribution system and the power flow fault analysis method therefore proposed by the present invention lie in that, a $Z_{MGD}$ analysis matrix may be obtained through a method for establishing an analysis procedure in an smart instrument to perform direct analysis and direct correction, and relative location elements in the matrix are used to analyze various types of grounding faults and asymmetrical faults of buses with boundary conditions and iterative skills. A test sample is used to perform relevant simulation tests, including an accuracy comparison test, a convergence test, and the effectiveness of the method proposed by the present invention which performs fault analysis and identification on the microgrid power distribution system may be verified.

Though the present invention has been disclosed above by the preferred embodiments, they are not intended to limit the present invention. Anybody skilled in the art can make some modifications and variations without departing from the spirit and scope of the present invention. Therefore, the protection scope of the present invention falls in the appended claims.

What is claimed is:

1. A microgrid distribution (MGD) system, comprising:
a smart apparatus, having a programmable device for executing a fault analysis method for a three-phase and single-phase mixed power distribution system by selecting at least one of single line-to-ground (SLG) fault analysis, double line-to-ground (DLG) fault analysis, open-conductor fault analysis, line-to-line (LL) fault analysis, and microturbine generation (MTG) fault analysis to solve a fault current, and for various types of faults of the microgrid distribution system, and obtaining appropriate boundary conditions to calculate a variety of different types of single or simultaneous fault currents of load points; and
a plurality of buses, at least one of which is connected to the smart apparatus;
wherein the programmable device executing the SLG, DLG, LL, open-conductor fault analysis, and MTG fault analysis method by using main relation matrix $Z_{MGD}$; and
wherein the main relation matrix $Z_{MGD}=Z_{V\text{-}BC} B_I$ in which $Z_{V\text{-}BC}$ is a first relation matrix while $B_I$ is a second relation matrix between a bus injection current and a branch current, and the relation matrix between the bus injection current [I] and the branch current [B] is denoted as $[B]=[B_I][I]$, and the matrix $B_I$ is an upper triangular matrix only comprising values of 0 and 1.

2. The microgrid distribution system according to claim 1, wherein the first relation matrix $Z_{V\text{-}BC}$ is an inter-bus impedance and is a lower triangular matrix, and the first relation matrix between the branch current and a bus voltage difference matrix $[\Delta V]$, and the main relation matrix $Z_{MGD}$ between the injection current and the bus voltage difference matrix $[\Delta V]$ are respectively denoted as:

$$[\Delta V]=[Z_{V\text{-}BC}][B]=[Z_{MGD}][I].$$

3. The microgrid distribution system according to claim 1, wherein the programmable device executes the SLG fault analysis step through an impedance $Z_f$, an SLG fault occurs in a phase a of a Bus i, which represents one of the buses that has a fault and boundary conditions are denoted as:

$$I_{i,f}^a = I_i^a + I_{i,slg}^a, I_{i,f}^b = I_i^b, I_{i,f}^c = I_i^c; \text{ and}$$

$$V_{i,f}^a = Z_f I_{i,slg}^a;$$

wherein $I_{i,f}^a$, $I_{i,f}^b$ and $I_{i,f}^c$ are equivalent currents occurring in fault locations of the phase a, a phase b and a phase c and flowing into the Bus i, $I_i^a$, $I_i^b$ and $I_i^c$ are pre-fault currents, and $V_{i,0}^a$ and $V_{i,f}^a$ are respectively a pre-fault voltage and a post-fault voltage;

and if an SLG fault occurs in the phase a of the Bus i, a fault current flows to the ground, a bus voltage of the phase a is changed from $V_{i,0}^a$ to $Z_f I_{i,slg}^a$, and after the fault, the change amount of the bus current is denoted as:

$$\Delta I_{i,f}^a = I_{i,slg}^a, \Delta I_{i,f}^b=0, \Delta I_{i,f}^c=0;$$

and through iteration, a fault voltage iterative formula is denoted as follows:

$$\Delta V_{i,f}^a = V_{i,0}^a - Z_f I_{i,slg}^a$$

$$\Delta I_{i,f}^a = \frac{V_{i,0}^a - \Delta V_{i,f}^a}{Z_f};$$

wherein the variations of the branch currents generated by the fault current in MGD can be expressed as $$[\Delta B_f^a]=[B_I][0 \ldots \Delta I_{i,f}^a 0 \ldots]^T;$$

where $B_I$ is the bus injection to a pre-fault of a branch current matrix having a general form expressed as $$[B_f]=[B_{MGD}]+[\Delta B_f^a];$$

where a bus mismatch voltages caused by the fault branch currents $\Delta B_f$ can be rewritten as $$[\Delta V_f]=[Z_{V\text{-}BC}][B_f]=[Z_{MGD}][I_f];$$

so that after a single-line-to-ground fault occurs, the branch mismatch currents and bus mismatch voltages caused by the single-line-to-ground fault can be calculated directly and the solution for MGD power flow can be expressed as $$[\Delta V_f^i]=[Z_{MGD,i}][I_f^i];$$

and a post-fault voltage of each bus is calculated by use of the following formula:

$$[V_f]=[V_0]-[\Delta V_f];$$

wherein $V_0$ is a no-load voltage or bus reference voltage.

4. The microgrid distribution system according to claim 1, wherein when the programmable device executes the DLG fault analysis, a DLG fault occurs in a phase a and a phase b of a Bus i, representing one of the buses that has a fault, through an impedance $Z_f$, and boundary conditions are denoted as:

$$\Delta I_{i,f}^a = I_{i,dlg}^a, \Delta I_{i,f}^b = I_{i,dlg}^b, \Delta I_{i,f}^c=0;$$

$$V_{i,f}^a = V_{i,f}^b = Z_f(\Delta I_{i,f}^a + \Delta I_{i,f}^b);$$

wherein the variations of the branch currents generated by the fault currents in MGD can be expressed as $$[\Delta B_f^{ab}] = [B_I][0 \ldots \Delta I_{i,f}^a \Delta I_{i,f}^b 0 \ldots]^T;$$

and, in MGD, the fault branch currents $B_f$ caused by the fault currents can be rewritten as $$[B_f] = [B_{MGD}] + [\Delta B_f^a];$$

so that the bus mismatch voltages caused by the fault branch currents $B_f$ can be rewritten as $$[\Delta V_f] = [Z_{V-BC}][B_f] = [Z_{MGD}][I_f];$$

whereby the fault currents and bus mismatch voltages caused by the double line-to-ground fault can be calculated directly and the solution for MGD power flow.

5. The microgrid distribution system according to claim 1, wherein when the programmable device executes the LL fault analysis, for an LL fault through an impedance $Z_f$, a phase a and a phase b of the Bus i, representing one of the buses that has a fault, are regarded as the LL fault, and boundary conditions of a fault point need to satisfy:

$$I_{i,f}^a = I_i^a + I_{i,ll}^{ab}, I_{i,f}^b = I_i^b - I_{i,ll}^{ab}, I_{i,f}^c = I_i^c; \text{ and}$$

$$V_{i,f}^a - V_{i,f}^b = Z_f I_{i,ll}^{ab}; \text{ and}$$

wherein a fault current iterative formula thereof is denoted as follows:

$$\Delta I_{i,f}^{ab} = \frac{V_{i,f}^a - V_{i,f}^b}{Z_f};$$

and a pre-fault load flow voltage solution is used as an initial condition so that a fault point branch current generated by a fault is denoted as:

$$[B_f] = \begin{bmatrix} B_{I,origin} & col \cdot (B_i^a - B_i^b) \\ 0 & 1 \end{bmatrix} \begin{bmatrix} I_{origin} \\ \Delta I_{i,f}^{ab} \end{bmatrix};$$

where the new column is column phase a minus column phase b of Bus i of $B_{I,origin}$, and the new row is filled with "0" in $B_{I,origin\ a}$ and, finally, "1" is filled to the end of the diagonal;

and a bus voltage difference matrix caused by the fault branch current $\Delta B_f$ is denoted as:

$$[\Delta V_f^i] = [Z_{V-BC,f}][B_f] = [Z_{MGD,f}][\Delta I_f^i];$$

in which the $Z_{V-BC,f}$ matrix is $$[Z_{V-BC,f}] = \begin{bmatrix} Z_{V-BC,origin} & 0 \\ row \cdot (Z_i^a - Z_i^b) & Z_f \end{bmatrix};$$

where the new row is row phase a minus row phase b of Bus i of $Z_{V-BC,origin}$, and $Z_f$ is filled to the position of the off-diagonal.

6. The microgrid distribution system according to claim 1, wherein when the programmable device executes the open-conductor fault analysis step, a negative branch current of a fault point generated by an open-conductor fault is a boundary condition of the open-conductor fault, which is denoted as:

$$[\Delta B_{f,OC}] = \begin{bmatrix} 0 & \cdots & \prod_{MG\ fault\ area} & -B_{ij}^a & 0 & \cdots \end{bmatrix}^T;$$

where the whole branch current of the system is rewritten as:

$$[B_f] = [B] + [\Delta B_{f,OC}];$$

and a bus voltage difference matrix caused by a fault branch current $\Delta B_f$ is denoted as:

$$[\Delta V_{f,OC}] = [Z_{V-BC,f}][B_{f,OC}].$$

7. The microgrid distribution system according to claim 1, wherein when the programmable device executes the MTG fault analysis step, boundary conditions of a fault point need to satisfy stand-alone mode and a grid-connected mode.

8. The microgrid distribution system according to claim 7, wherein, in stand-alone mode, the MTG serves as an independent voltage source for supplying power to loads, and internal voltage $V_{0\_MT}$ is constant at the instant of the fault so that the boundary conditions can be written as $$\Delta V_{0\_MT,f}^{abc} = 0$$

$$V_{g,f}^{abc} = V_f;$$

and a sensitivity matrix is used to calculate the injection current needed to keep the MTG's internal voltage constant, wherein relationships of voltage variations after a fault can be expressed as $$[V_{0\_MT,f}] - [V_f] = [Z_{0\_MT}][I_{g\_n,f}]; \text{ and}$$

$$[V_{0\_MT,0} - \Delta V_{0\_MT,f}] - [V_{f,0} - \Delta V_f] = [Z_{0\_MT}][I_{g\_n,f}]$$

whereby the MGT terminal bus correction voltages after the fault occurred can be expressed as $$[\Delta V_f^i] = [Z_{0\_MT,f}][I_{g\_n,f}^i] - [V_{0\_MT,0} - V_{f,0}]$$

$$I_{g,f} = \sum_{n=1}^{N} I_{g\_n,f}$$

where N is the number of connected power modules, and n is the nth module in MTG.

9. The microgrid distribution system according to claim 7, wherein, in grid-connected mode, in grid-connected mode, the MTG can operate as a power conditioner for the grid-connected mode to improve the microgrid quality of supplying power or sever as an emergency generator from the grid, and being based on the control strategy of grid-connected concept, the MTG terminal fault current can be written as $$[I_{g\_n,f}] = [I_{0\_MT}] - [Y_{0\_MT}][V_{g,f}]$$

$$I_{g,f} = \sum_{n=1}^{N} I_{g\_n,f};$$

wherein the admittance matrix $Y_{0\_MT}$ and the MTG internal balanced current source $I_{0\_MT}$ are held constant in faults analysis, and the load flow voltage solution by iterative process is written as $$[\Delta V_f^i] = [Z_{MGD,f}][I_{g,f}^i].$$

* * * * *